MEANS FOR OPERATIVELY CONNECTING PRINTED CIRCUIT BOARDS

Filed April 30, 1965

3 Sheets-Sheet 1

MEANS FOR OPERATIVELY CONNECTING PRINTED CIRCUIT BOARDS

Filed April 30, 1965 3 Sheets-Sheet 2

April 2, 1968 W. R. WINES ETAL 3,376,479

MEANS FOR OPERATIVELY CONNECTING PRINTED CIRCUIT BOARDS

Filed April 30, 1965 3 Sheets-Sheet 3

United States Patent Office 3,376,479

Patented Apr. 2, 1968

3,376,479

MEANS FOR OPERATIVELY CONNECTING PRINTED CIRCUIT BOARDS

Warren R. Wines, Norwalk, Jay W. Sturdevant, Ridgefield, and Matthew Cannizzaro, South Norwalk, Conn., assignors to Sperry Rand Corporation, New York, N.Y., a corporation of Delaware Filed Apr. 30, 1965, Ser. No. 452,294
7 Claims. (Cl. 317—101)

ABSTRACT OF THE DISCLOSURE

An arrangement for operatively interconnecting a plurality of planar electronic packages for utilization as a rigid modular device. The elements comprising such packages are adapted for ready access to facilitate testing, replacement and repair operations. During access the module exposes the elements in the manner of an open book, while still maintaining insulated electrical interconnections without exerting mechanical stress.

The present invention relates in general to printed circuits, and more particularly to a printed circuit arrangement of the book- or printed circuit card library-type wherein a plurality of printed circuit cards are arranged in modular form and secured along one common edge thereof in such a way that the cards may be opened or separated from one another in the manner of the pages of a book.

The advent and development of printed circuit techniques and the use of printed circuit modules in complicated electronic devices has proven to be a very important step along the road to miniaturization of these electronic devices; however, these large modules have created their own special problems, relating to the interconnection of circuits from one printed board to another in the module, proper spacing between the various printed boards so as to permit utilization of both sides of the printed circuit board without creating interference problems from one board to another, and most important of all, the problem of access to the printed circuit module for purposes of replacement of parts or repair thereof when necessary.

The problem of access to the printed circuit module has been solved by the so-called book type package, or as referred to in the electronic packaging art, the printed circuit card library, wherein the plurality of printed circuit boards are hinged or secured in some manner along one common edge thereof so that the cards may be rotated or flipped in the manner of the pages of a book providing easy access to each of the cards in the module. However, with the elimination of the access problem through adoption of a book-type package, the problems relating to interconnection, spacing, and securing of the module were retained, and in many instances increased. This is especially true of the problem of interconnection between the various boards in the module in such a way that the package can be opened for access to a given board without danger of breaking the connections to one or more of the boards in the module. The problem of spacing in this type of an arrangement is also acute in that where the printed boards are provided with interconnections on both sides of the boards, the boards must be properly spaced at all times to prevent interference between the components on one board and the circuits printed on the underside of the adjacent board.

It is therefore an object of the instant invention to provide a printed circuit module of the book type wherein all of the problems relating to similar devices of the prior art are materially reduced or altogether eliminated.

It is another object of the instant invention to provide a printed circuit module of the book type wherein the hinge-like means physically connecting the boards is constructed so as to relieve the strain on electrical connections between the various boards during opening and closing of the book package.

It is a further object of the instant invention to provide a printed circuit module of the book-type wherein the hinge-like members interconnecting the individual printed boards are constructed so as to maintain a constant spacing between the boards even when separated, without providing a rigid interconnection.

It is still another object of the instant invention to provide a printed circuit module of the book-type wherein electrical interconnection between the various boards of the module is provided along the hinged side thereof to both sides of the boards in such a way that forces transmitted to the electrical interconnections through opening and closing of the printed circuit module are prevented from affecting the physical connections to the board.

It is still another object of the instant invention to provide a printed circuit module of the book-type wherein means are provided for effectively spacing each of the boards across their entire surface so as to prevent interference between components on one board and electrical circuits on an adjacent board.

The many objects and advantages of the instant invention can be seen from the above discussion, and will be further clarified by the following description when taken in conjunction with the accompanying drawings, wherein.

Figures 2, 4, 4A:
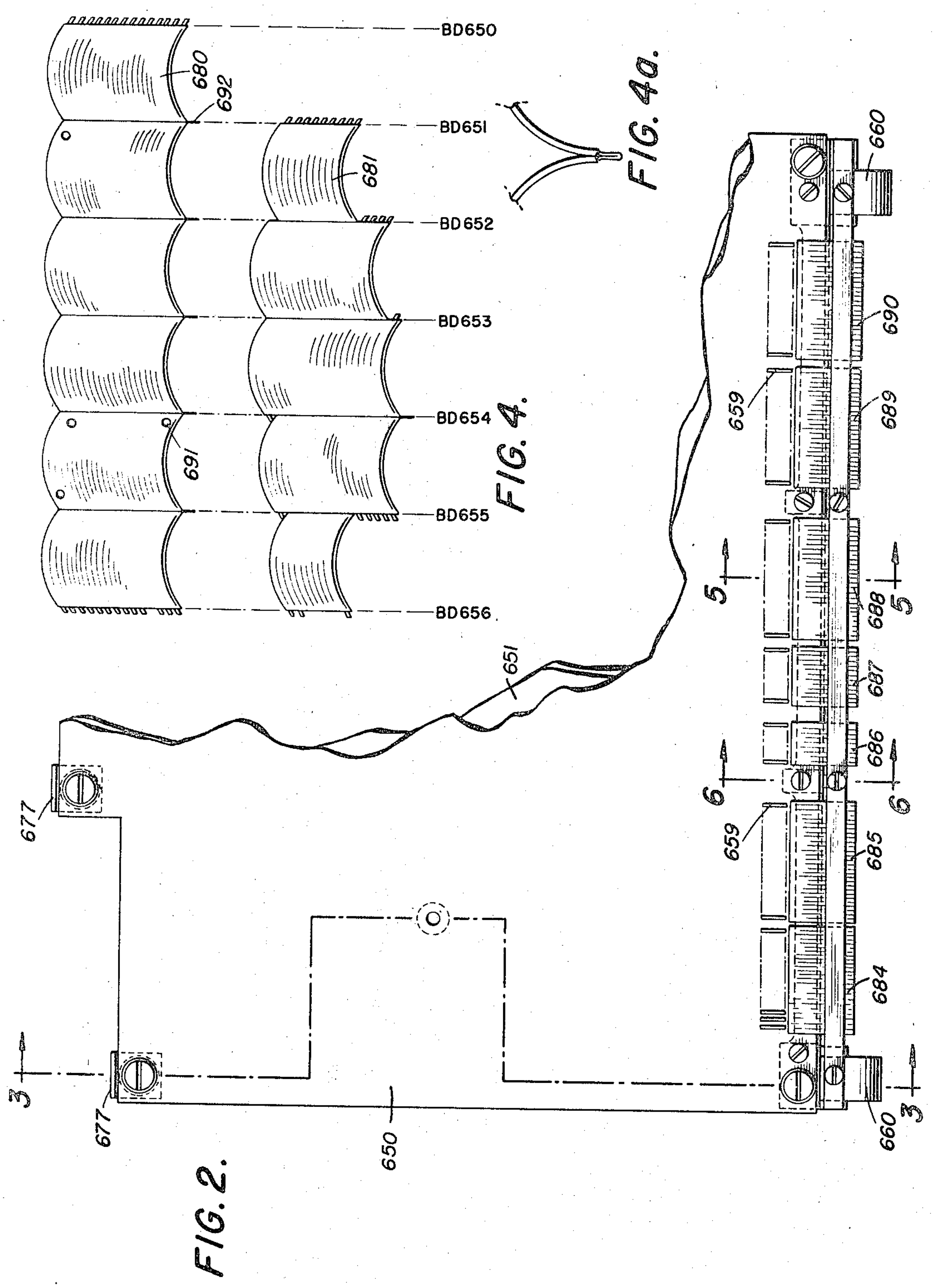
FIG. 2 is a top plan view partly cut away of the printed circuit module illustrated in FIG. 1.
FIG. 4 is a detail view of a pair of super-imposed flexible cables utilized for interconnection between the boards of the module.
Figure 5:
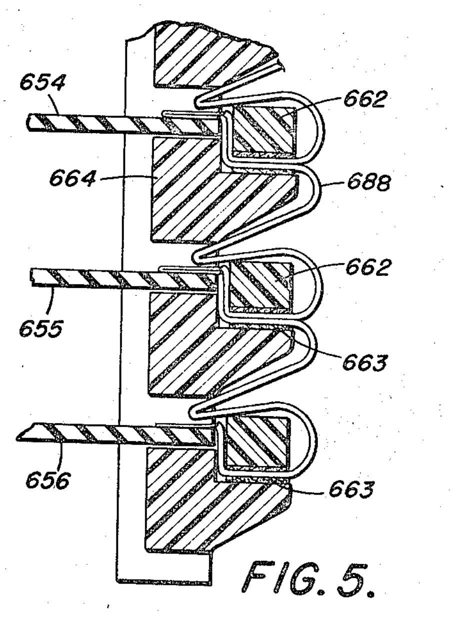

FIG. *4a* is a detail view of a portion of the flexible cable assembly illustrated in FIG. 4;

FIG. 5 is a partial section view taken along lines 5—5 in FIG. 2; and

Figure 6:
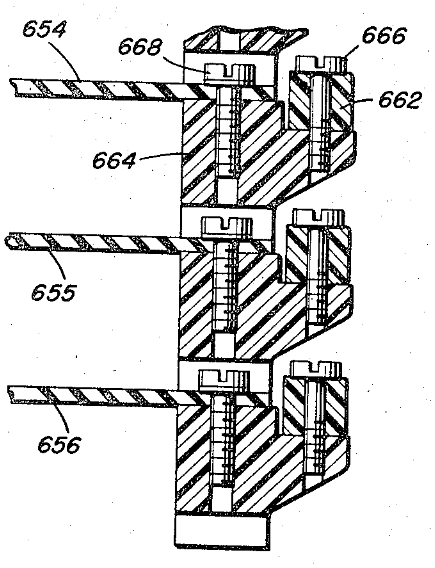

FIG. 6 is a partial section view taken long lines 6—6 in FIG. 2.

Figure 1:
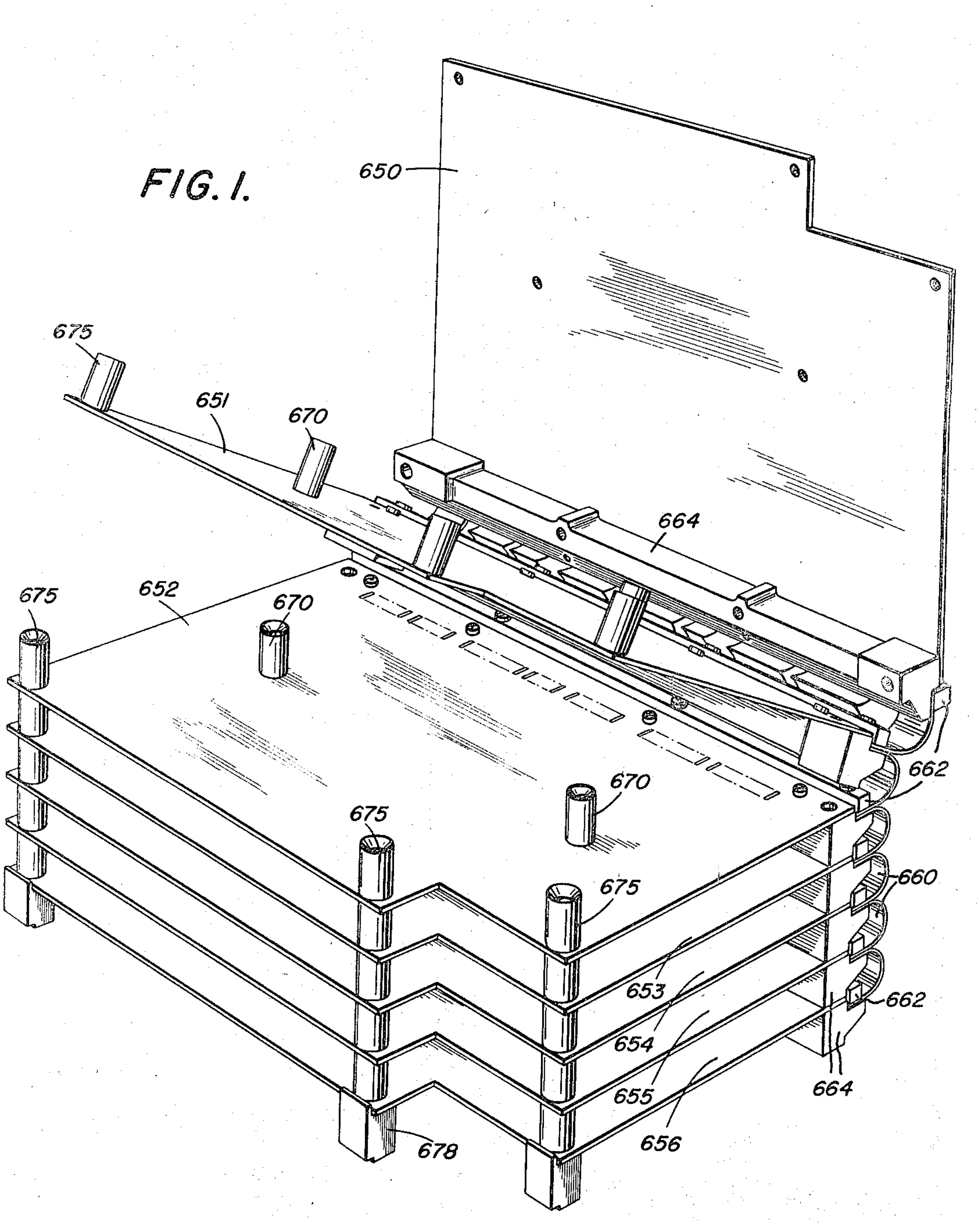
FIG. 1 is a perspective view of a book-type printed circuit module incorporating the specific features of the instant invention.

Turning now to the drawings, wherein like elements have been identified by similar reference numerals wherever possible, and more particularly to FIG. 1, a book-type module in the partly opened position and incorporating the specific features of the instant invention is illustrated as including a plurality of printed circuit boards 650–656, which boards are of standard construction and configuration, preferably including electrical components (not shown) on one side thereof and including the normal conducting lines on one or both sides of each of the boards providing for the required circuit connections for these electrical components.

While only seven boards are illustrated in the module of FIG. 1, it should be understood that the invention is not limited to a specific number of boards nor to boards of any particular size or configuration. However, in order to clearly bring forth certain advantageous features of the instant invention it will be assumed in the following discussion that each printed board is provided with interconnections between the circuit elements on both sides of the boards and output terminals are provided on each board, either on one or both sides thereof, along one entire edge so that interconnection between the boards is made possible.

Figure 3:
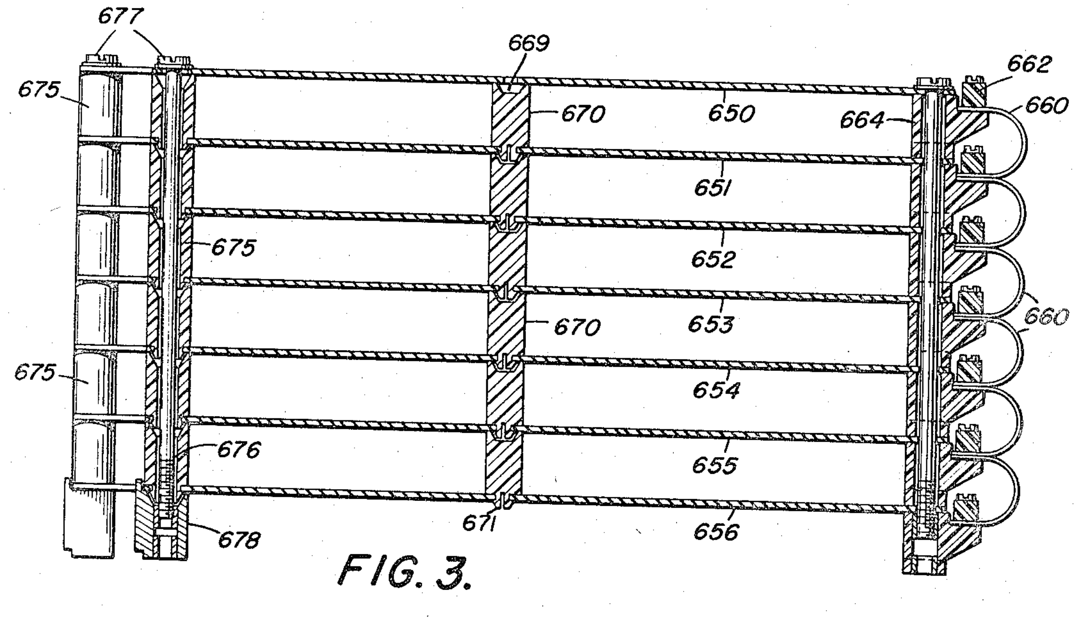
FIG. 3 is a section view taken along lines 3—3 in FIG. 2.

As seen in FIGS. 2 and 3, the boards 650–656 are normally positioned in a spaced, stacked relationship with the boards being physically interconnected into a book-type module by means of a plurality of U-shaped springs 660, formed of flat flexible strip material and having a natural set either in the U-shaped configuration, so that the springs 660 will have a tendency to maintain the printed cards in a parallel stacked relationship, whereby a physical separation of the cards will be effected against the natural bias of the springs. If, on the other hand, the springs 660 are provided with a flat natural set, which is somewhat less desirable, natural bias of the springs will tend to force the module into an open configuration with each of the boards spread from one another, the parallel stacked configuration being obtained only by forcing the cards together against the natural bias of the springs 660.

As indicated in FIG. 2, the springs 660 are positioned between successive boards at spaced points along a common edge of the module so as to effectively provide a hinge similar to a book binding. As a result of this flexible interconnection between the boards, access to a particular board in the module is facilitated such that an operator may turn from one card to the next much the same as a reader turns the pages in a book. The spring hinges also maintain the cards physically spaced when the module is opened and as will be explained more fully hereinafter provides a strain relief for the interconnecting flexible cables connected to the printed circuit boards.

As seen in FIGS. 3 and 6, the springs 660 are secured by individual cable clamp assemblies mounted to each board, each cable clamp assembly consisting of an upper block 662 and a lower spacer block 664. The upper block 662 of each assembly is secured to the lower spacer blocks 664 by suitable fastening means 666, and the lower spacer blocks 664 are in turn secured to the respective printed circuit boards by means of similar securing means 668. The spacer blocks 664 fastened to each of the printed circuit boards are maintained in registration providing not only a support for the upper block 662, but also serving as a spacer between the respective boards of the module.

The module is also provided with a plurality of spacers 670 which are utilized to add rigidity to the center of the module and provide accurate spacing between the printed circuit boards. The spacers 670 correspond in length to the lower spacer blocks 664 of the cable clamp assemblies and are provided at one end thereof with flexible locking projections 671 (FIG. 3) which engage in a snap-lock manner with a suitable apertures in the printed circuit board so that the spacers can be removably fastened to the board. The opposite end of each of the spacer elements 670 is provided with a suitable opening or recess 669 having a size and configuration corresponding to that of a locking projection 671, so that in the stacked position, as seen in FIG. 3, the projecting end of the locking projection 671 of one spacer is accommodated within the opening or recess 669 in the upper portion of the next lower spacer element 670, effectively providing a stacked or interlocking support through the depth of the module.

Additional spacer elements 675 are provided, as illustrated, along the corners and edges of each of the printed circuit boards in the module opposite to the edge provided with the spring hinge 660, which spacer elements 675 are of a substantially identical configuration and size as the elements 670, but are provided with a central through bore 676 such that in the stacked configuration of the module, the bores 676 of the spacer elements 675 will be in substantial alignment providing a bore through the module capable of accommodating a bolt 677 which cooperates with a suitable spacer fastener 678 to lock the free end of the module. Thus, the spring hinge arrangement 660 and the bolts 677 serve to clamp the boards 650–656 together in sandwich fashion with the spacer elements 664, 670 and 675 maintaining the boards in spaced parallel relationship.

Each of the printed circuit cards 650–656 of the module are interconnected electrically by suitable flexible cable combinations 684–690, as illustrated in FIGS. 2 and 5. The cables are formed by embedding a plurality of conductors in suitable web-like insulation so that the conductors are maintained within the cable in parallel spaced relationship. The cables are then provided with a plurality of folds equally spaced and equal in number to the number of associated printed circuit boards provided in the printed circuit module. Connections to the various boards in the module are then effected by initially stripping the cables at the end thereof to expose those conductors which are to be connected to the top and bottom boards of the module and also stripping the conductors at the folds when necessary, in the manner illustrated in FIG. 4*a*. The cables are then mounted on the printed circuit module with the folds of each of the cables inserted between rubber tape inserts 663 and secured between the upper block 662 and lower spacer block 664 of each clamping assembly. The stripped conductors, if any, then pass through the clamping assembly and are secured to the printed board.

While it is usually known to provide but a single flexible cable for connection to a given area of the module, it is an advantageous feature of the instant invention to provide a double cable arrangement wherein two cables such as cables 680 and 681 in FIG. 4 may be provided in overlapping relationship to one another with the cable 681 being the inner cable and the cable 680 being the outer cable of a cable assembly such as 685 in FIGURE 2. The folds of each of the cables in such a double cable construction are inserted into the cable clamp assemblies together thereby physically locking the cable to the module. The stripped conductors both at the ends and at the folds are then soldered to appropriate contact fingers on the printed circuit cards providing the necessary interconnection between the boards. However, if none of the conductors at a fold are stripped, as determined by circuit signal path requirements then in assembly the folded portion of the cable is maintained by the clamp assembly merely for the purpose of being physically secured.

Looking to FIG. 2, it is noted that in the illustrated embodiment, cable assemblies 684–690 are spaced along the entire edge of the module between the hinge spring 660. These cable assemblies may be provided as a single cable or double cable as indicated above in accordance with the requirements of the various circuit connections necessary in the module. Because the cable assemblies are clamped by the cable clamp assemblies associated with each of the boards of the module, an opening of the module for access to a selected board will not affect the electrical connections of the cables to the boards since flexing of the cables produced by movement of the boards will be restrained at the cable clamp assemblies.

Looking more closely to the cables 680 and 681 as illustrated in FIG. 4, it is noted that portions of the conductors in any of the cables may be omitted where interconnection between boards is not necessary at that point so that the number of conductors between two adjacent boards may be different from the number provided for two other adjacent boards and these gaps in the conductor strips may facilitate the connection of cables from the outer cable strip to the printed circuit boards. The cable strips may also be provided with cut out portions in the form of holes 691 which serve to interrupt a selected signal path in the cable without the need for physically removing that portion of the cable between boards, which might physically weaken the cable strip at that portion.

The cables 680 and 681 are an example of a double layer cable arrangement such that the cable 680 will be disposed in the same general transverse location as the cable 681 and in overlapping manner therewith; however, in no instance is a conductor from cable 680 soldered to the same contact finger on a printed circuit board as a conductor from cable 681. This condition is satisfied at the end stripped conductor portions by soldering the conductors of one cable to one side of the board and conductors of the other cable to the other side of the same printed circuit board. For example, the stripped end conductors of cable 680 are connected to one side of board 656, schematically illustrated by the broken line designated BD656 as seen in FIG. 4, and the end strip conductors of cable 681 are connected to the other side of the same printed circuit board. The condition is satisfied at the folds by positioning the cable having non-stripped folds at the outside of the cable having stripped loops at the folds, which cable is made the inner cable. Of course, the elimination of portions of one of the cables, especially the inner cable, such as seen in FIG. 4, would allow connection between conductors of the outer cable and a board without difficulty.

As seen in FIG. 4, the conductors in the strip 680 at the fold associated with board 651, with the exception of a single end conductor 692, are not stripped, whereas the conductors at the end of strip 681 to be connected to the board 651 are stripped but do not interfere with the stripped conductor 692 on the strip 680 and are not interfered with by the non-stripped conductors in the fold in strip 680. Thus, where an overlap of cables occurs at the folds, the conductors of the inner cable may be soldered and are therefore electrically connected at the board whereas the conductors of the outer cable are in no instance electrically connected to such board but are merely physically retained by the cable clamp members at the board.

With regard to a physical connection at the folds in a double layer arrangement, it is effected in the same manner as for a single layer cable, i.e., the cable clamp assemblies secure the cable adjacent the folds to reduce strain on the soldered joints where applicable and to provide physical securement for the cables that are not stripped. Where an overlap occurs, both cables are secured at overlapping folds by the same portion of the cable clamp assembly; however, the outer cable is secured in a manner whereby the innermost portion of the non-stripped fold will not interfere with the same cable fold including stripped conductor portions.

During normal use of the printed circuit package described and illustrated herein, the module is retained in the locked position with the bolts 677 securing the various boards in their parallel spaced configuration, such as illustrated in FIG. 3, with the spacers 670 and 675 and the spacer block member 664 determining the parallel relationship of the boards and maintaining physical separation throughout the module. Interconnection between the various boards of the module is effected by means of flexible cables looped between the boards and physically secured at each board level of the module by a cable clamping arrangement which serve as a strain relief for the electrical connections when the module is open for inspection or other reasons. The spring steel hinges 660 which are looped between the various boards maintain the cards fixedly spaced when the module is disassembled and this provides additional strain relief for the interconnecting flexible cables when turning from one board to the next. The springs 660 also serve to maintain the constant spacing between the cards necessary especially when the module is open.

The spacers 670 and 675 provide for advantageous support between the various boards of the module while being secured to only one board so that an opening of the printed circuit module is facilitated without the necessity to effect an additional unlocking of boards from the individual spacers before the module can be opened. The locking feature incorporated into the spacer elements also prevents loss of the elements while the package is in the open position.

We claim:

1. A printed circuit module of the book-type comprising a plurality of printed circuit boards, spring hinge means interconnecting and resiliently supporting said printed circuit boards along one edge thereof in spaced juxtaposed relationship, and electrical cable means electrically connected to selected ones of said printed circuit boards, said spring hinge means comprising a plurality of flat leaf springs secured between adjacent boards of said module, said flat leaf springs being normally U-shaped tending to bias said boards toward one another.

2. A printed circuit module as set forth in claim 1 wherein each of said plurality of printed circuit boards is provided with output means along one edge thereof, individual spacer means are secured to said printed circuit boards remote from said one edge for spacing said boards, at least one continuous interconnecting cable of electrical conductors is secured to the output means of selected printed circuit boards and extending between the outer boards of said module, and strain relief means secured to each printed circuit board for physically restraining said cable at selective points along the length thereof.

3. A printed circuit module as set forth in claim 2 wherein said interconnecting cable is provided with a plurality of folds spaced along the length of said cable with each fold being positioned adjacent one board of said module, said electrical conductors of said cable being exposed at selected ends and folds thereof with said exposed conductors being electrically connected to the boards of said module.

4. A printed circuit module as set forth in claim 3 wherein said strain relief means includes a first block and a second block, said second block being secured to a respective printed circuit board and said first block being secured to said second block with a fold of said cable clamped therebetween.

5. A printed circuit module as set forth in claim 1 wherein said plurality of printed circuit boards each is provided with output means along one edge thereof, individual spacer means are secured to said printed circuit boards remote from said one edge for spacing said boards, said cable means comprises at least one continuous interconnecting cable of electrical conductors is secured to the output means of selected printed circuit boards and extending between the outer boards of said module, strain relief means are secured to each printed circuit board for physically restraining said cable means at selective points along the length thereof and adapted to provide spacing between said boards corresponding to the spacing provided by said spacer means, said individual spacer means have locking projections on one end thereof and a recess corresponding in configuration to said projection at the other end thereof, and said locking projection on said spacer means engaging with said apertures in said printed circuit boards at spaced points thereof to uniformly space said circuit boards under conditions where said leaf springs urge said boards toward one another.

6. A printed circuit module as set forth in claim 5 wherein said interconnecting cable means is provided with a plurality of folds spaced along the length of said cable means with each fold being positioned adjacent one board of said module, said electrical conductors of said cable are exposed at selected ends and folds thereof with said exposed conductors being electrically connected to the boards of said module, and said strain relief means includes a plurality of block pairs each comprising a first block and a second block, said second block being secured to a respective printed circuit board and said first block being secured to said second block with a fold of said cable clamped therebetween.

7. A printed circuit module as set forth in claim 6 wherein said cable means comprises at least two web-shaped, printed-circuit cables having similarly disposed folds and arranged in overlapping relationship whereby said strain relief members receive double layer folds.

References Cited

UNITED STATES PATENTS

| | | | |
|---|---|---|---|
| 2,740,097 | 3/1956 | Edelman et al. | 317—101 |
| 3,048,806 | 7/1962 | Heidler | 339—17 |

OTHER REFERENCES

Smith et al.: "Making the Most of Flat Cables," electronic design, October 28, 1959, pp. 36–39.

Smith et al.: "Making the Most of Flat Cables," electronic design, October 14, 1959, pp. 57–59.

ROBERT K. SCHAEFER, *Primary Examiner.*

D. SMITH, *Assistant Examiner.*